United States Patent [19]
Jen et al.

[11] Patent Number: 5,955,757
[45] Date of Patent: Sep. 21, 1999

[54] DRAM STRUCTURE WITH MULTIPLE MEMORY CELLS SHARING THE SAME BIT-LINE CONTACT

[75] Inventors: Tean-Sen Jen, Chiayih; Shiou-Yu Wang, Taipei; Jia-Shyong Cheng, Hsinchu Hsien, all of Taiwan

[73] Assignee: Nan Ya Technology Corp., Taiwan

[21] Appl. No.: 09/054,547

[22] Filed: Apr. 3, 1998

[30] Foreign Application Priority Data

Dec. 1, 1997 [TW] Taiwan .................................. 86118053

[51] Int. Cl.⁶ .................................................. H01L 27/108
[52] U.S. Cl. .......................... 257/296; 257/303; 257/306; 257/904; 257/906; 365/149; 365/174
[58] Field of Search ..................................... 257/296, 303, 257/306, 904, 905, 906, 907; 365/149, 174

[56] References Cited

U.S. PATENT DOCUMENTS

5,583,358  12/1996  Kimura et al. ............................ 257/306
5,828,094  10/1998  Lee .......................................... 257/296

Primary Examiner—Valencia Martin-Wallace
Attorney, Agent, or Firm—Michael D. Bednarek; Crowell & Moring LLP

[57] ABSTRACT

The present invention discloses a DRAM structure with multiple memory cells sharing the same bit-line contact. The DRAM structure of the present invention comprises: a substrate; an active region formed on the substrate, with a center region and a plurality of protrusion regions connecting to the two sides of the center region; a plurality of word-lines, disconnected from each other, each crossing the corresponding protrusion region; a plurality of channel regions, formed where the protrusion region overlaps with the word-lines; a plurality of source regions, formed at the outer areas of the channel regions; a sharing drain region, formed at the center region of the active region; a bit-line contact, formed on surface of the sharing drain region; a bit-line, crossing the center region and electrically connected to the sharing drain region via the bit-line contact; a plurality of capacitors, electrically connected to the source regions; and a plurality of metal lines, electrically connected to the corresponding word-lines.

6 Claims, 8 Drawing Sheets

DRAM STRUCTURE WITH MULTIPLE MEMORY CELLS SHARING THE SAME BIT-LINE CONTACT

BACKGROUND OF THE INVENTION

1. Field of the Invention

The present invention relates to a DRAM structure and fabrication method thereof, and especially relates to a DRAM structure with multiple memory cells sharing the same bit-line contact and fabrication method thereof.

2. Description of the Related Art

Recently, the capacitor has come to play a more and more important role in the design of semiconductor circuits, such as in DRAM, oscillators, time delay circuitry, ADC and DAC, etc.

The capacitor consists of two conducting plates (i.e. electrode plates) with an insulating material sandwiched between. The charging-storing capacity of the capacitor is determined by three physical characteristics: (1) the thickness of the insulating material; (2) the surface area of the electrode plate; and the (3) electrical or mechanic parameters of the insulating material and the plates.

In the case of DRAM, in order to fabricate a lot of memory cells in the same memory device, the base area of the memory cells must be small. At the same time, the electrode plates of the capacitors of the memory cells must have sufficient surface area to store enough charge.

Therefore, a three-dimensional stacked capacitor cell (STC) or trenched capacitor cell has been developed in a dense memory device. These capacitors form electrode plates of capacitors in the upper space of the storage devices in the silicon wafer or under the substrate. This kind of structure has the advantages of low soft error rate (SER) and capability of being attached with an insulating layer of high dielectric constant.

However, the size of the prior 3D capacitors is limited because of the difficulty in reducing the size of word-lines and bit-lines.

Figure 1A:
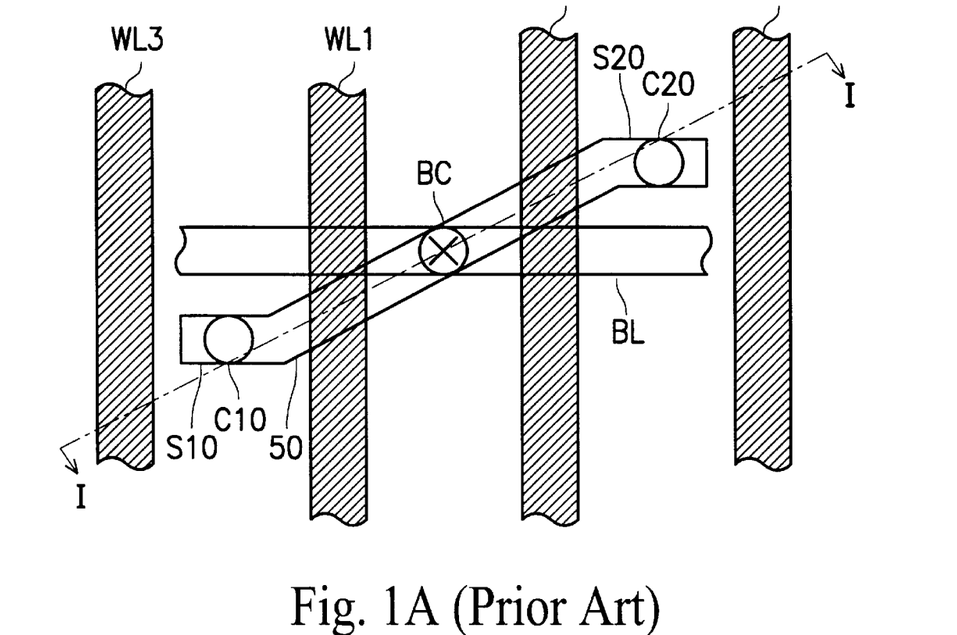
FIG. 1A shows a layout of a conventional DRAM array.
Figure 1B:
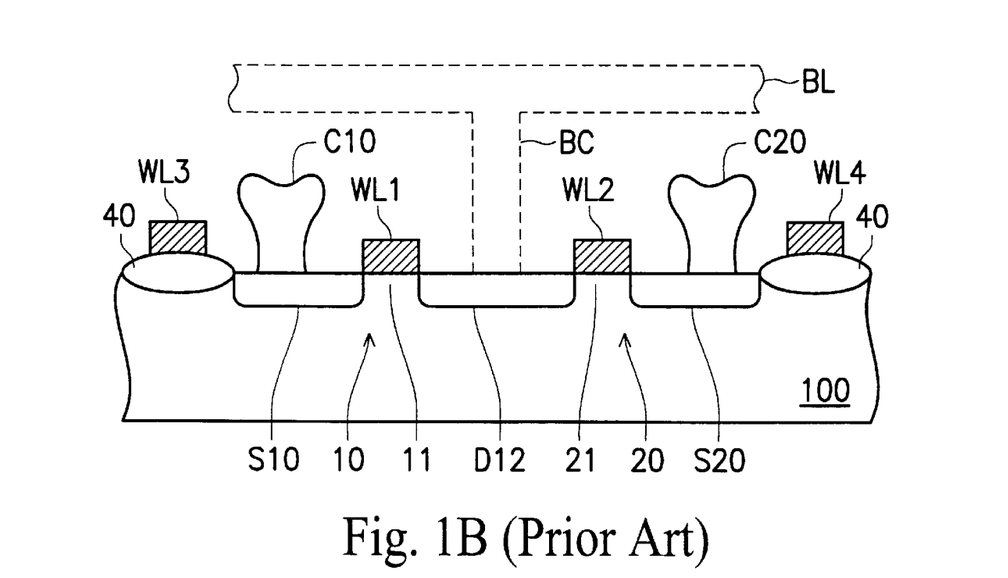
FIG. 1B is a cross-sectional diagram along line I—I in FIG. 1A.

Referring to FIG. 1A, 1B and 1C FIG. 1A shows a layout of a DRAM array of the prior art, and FIG. 1B are a cross-sectional figure along line I—I in FIG. 1A. In a conventional DRAM array, an active region 50 is formed on a substrate 100, and is isolated by a field insulating layer 40. Word-lines WL1 and WL2, which serve as gates, cross over the active region 50. The parts of the active region 50 under the word-lines WL1 and WL2 serve as channel regions 11 and 12. The parts of the active region 50 outside the word-lines WL1 and WL2 serve as source regions S10 and S20. The part of the active region 50 between the word-lines WL1 and WL2 serves as a drain region D12. The bit-line BL is electrically connected to the drain region D12 through the contact BC.

The capacitors, such as stacked capacitors or french capacitors C10 and C20, are formed on the source regions. Other word-lines on the field insulating layer 40, such as word-lines WL3 and WL4, serve as gates of other memory cells.

In the conventional DRAM array, an active region 50 comprises two memory cells, with four word-lines WL1~WL4 passing through. One bit-line contact BC is only shared by two memory cells. Therefore, it is difficult to significantly reduce the size of device.

SUMMARY OF THE INVENTION

Therefore, the present invention discloses a DRAM with multiple memory cells sharing the same bit-line contact. In the present invention, the integration is increased without changing outer circuits. The present invention is suitable for deep sub-micron processes, especially for embedded DRAM array with multi-layer metal interconnections.

The present invention discloses a DRAM structure with multiple memory cells sharing the same bit-line contact. The DRAM structure of the present invention comprises: a substrate; an active region, formed on the substrate, with a center region and a plurality of protrusion regions connecting to the two sides of the center region; a plurality of word-lines, disconnected with each other, each across the corresponding protrusion region; a plurality of channel regions, formed where the protrusion region overlaps with the word-lines; a plurality of source regions, formed at outer place of the channel regions; a sharing drain region, formed at the center region of the active region; a bit-line contact, formed on surface of the sharing drain region; a bit-line, across the center region and electrically connected to the sharing drain region via the bit-line contact; a plurality of capacitors, electrically connected to the source regions; and a plurality of metal lines, electrically connected to the corresponding word-lines.

The present invention also discloses a method for fabricating a DRAM structure with multiple memory cells sharing the same bit-line contact. The method of the present invention comprises: (a) providing a substrate; (b) defining an active region on the substrate, comprising a center region and a plurality of protrusions connecting to two sides of the center region; (c) defining a plurality of word-lines on the active region, wherein each word-line is disconnected from the others and crosses the corresponding protrusion; (d) forming a plurality of channels at the locations where the protrusions are overlapped by the word-lines, and doping the active regions via the word-lines to form a sharing drain region at the center region and a plurality of source regions where the protrusions are outside the channel regions; (e) forming an insulator capping the substrate, and then forming a bit-line contact exposing a partial surface of the sharing drain region; (f) forming a bit-line on the substrate, across the center region and electrically connected to the sharing drain region via the bit-line contact; and (g) forming a plurality of metal lines electrically connected to the corresponding word-lines.

DESCRIPTION OF THE DRAWINGS

Other objects, features, and advantages of the present invention will become apparent from the following detailed description made with reference to an illustrative but non-limiting embodiment. The description is made with reference to the accompanying drawings, in which.

DESCRIPTION OF THE PREFERRED EMBODIMENT

FIG. 2A~2G show the process steps of one embodiment of the present invention. The following description pertains to the case of a trench capacitor.

Figure 2A:
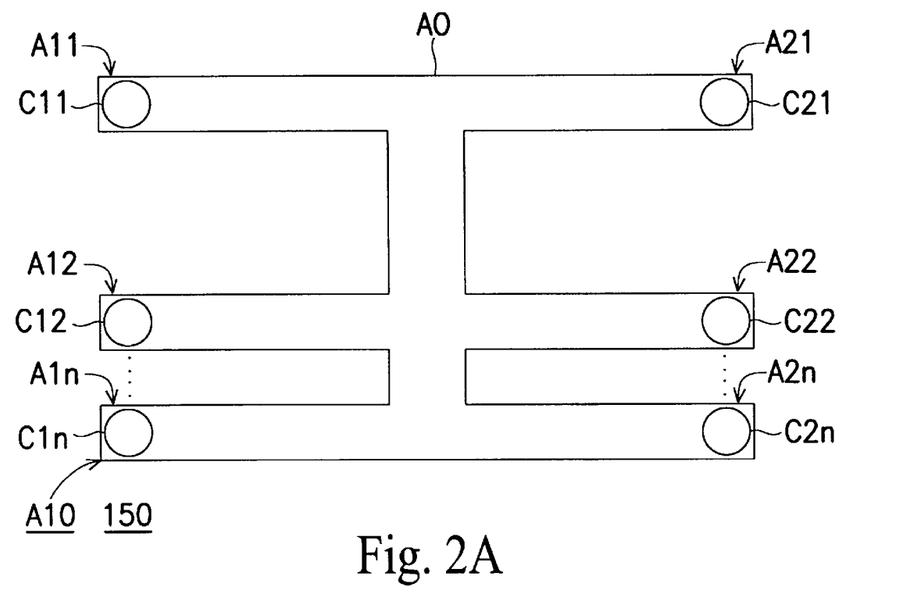
FIG. 2A~2G show formation steps of one embodiment of the present invention.

In FIG. 2A, a substrate 150 is provided. An active region array is formed. The active region array comprises a plurality of active regions such as A10 in the form of array. Then, each active region A10 is isolated on the substrate 150. The active region A10 has a center region A0 at its center, and a plurality of protrusion regions A11~A1n and A21~A2n.

Then, trench capacitors C11~C1n and C21~C2n are formed at the predetermined places of the protrusion region A11~A1n and A21~A2n by the prior process.

Figure 2B:
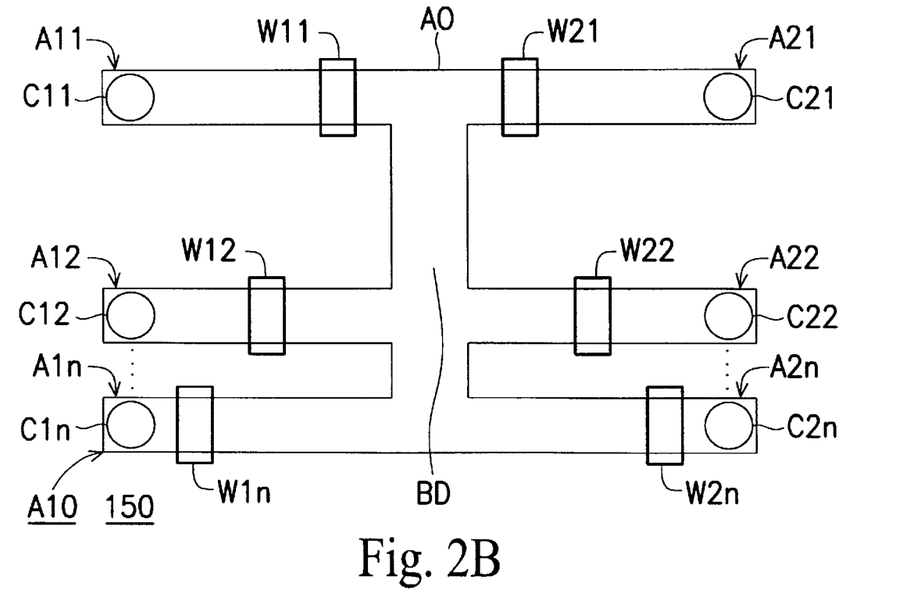

In FIG. 2B, a first conducting layer (not shown) is formed on the active region A10. The first conducting layer is defined to form a plurality of individual word-lines WL11~WL1n and WL21~WL2n which cross over corresponding protrusion regions A11~A1n and A21~A2n.

Figure 2C:
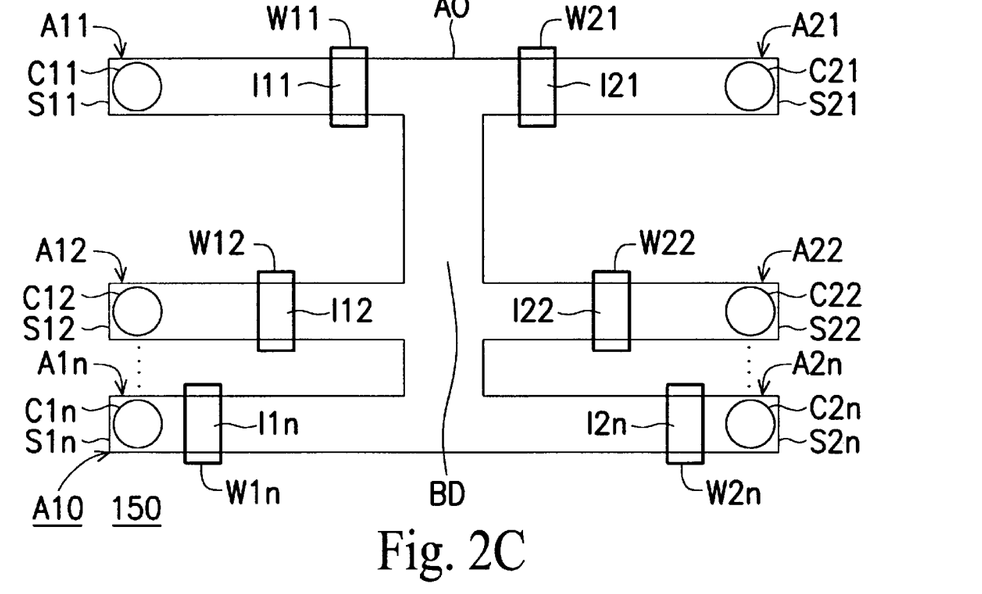

In FIG. 2C, ion is doped into the active region A10 via masks, word-lines W11~W1n and W21~W2n, to form a sharing drain region BD on the center region A0. The part of the word-lines WL11~WL1n and WL21~WL2n overlapping with protrusion regions A11~A1n and A21~A2n form a plurality of channel regions I11~I1n and I21~I2n. A plurality of source regions S11~S1n and S21~S2n are formed where the protrusion regions lie outside these channel regions.

Figure 2D:
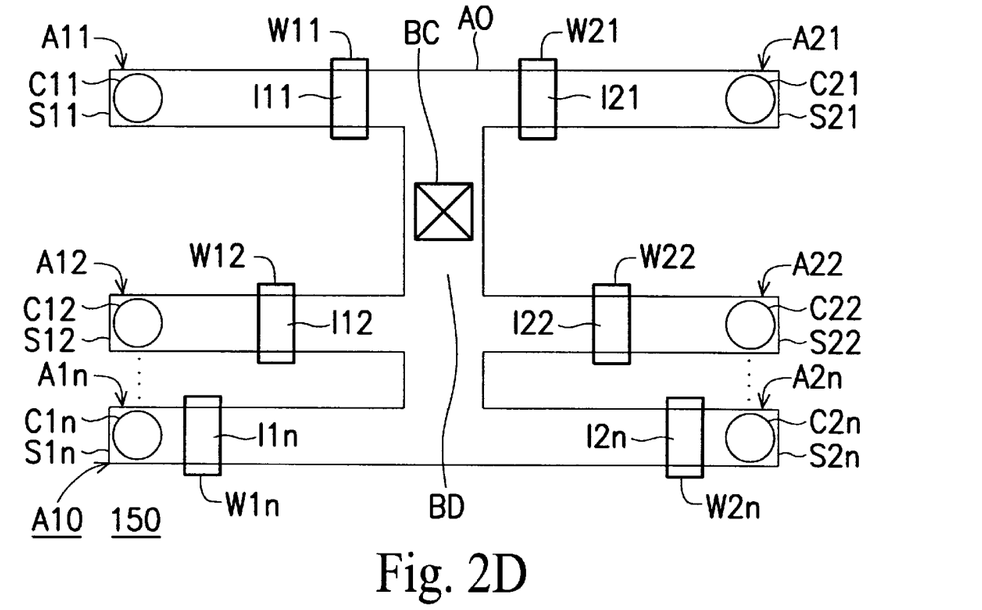

Now refer to FIG. 2D. In FIG. 2D, a first insulator (not shown) is formed to cap the substrate 150. A bit-line contact BC, exposing a part surface of the sharing drain region BD, is formed via defining this first insulator.

Figure 2E:
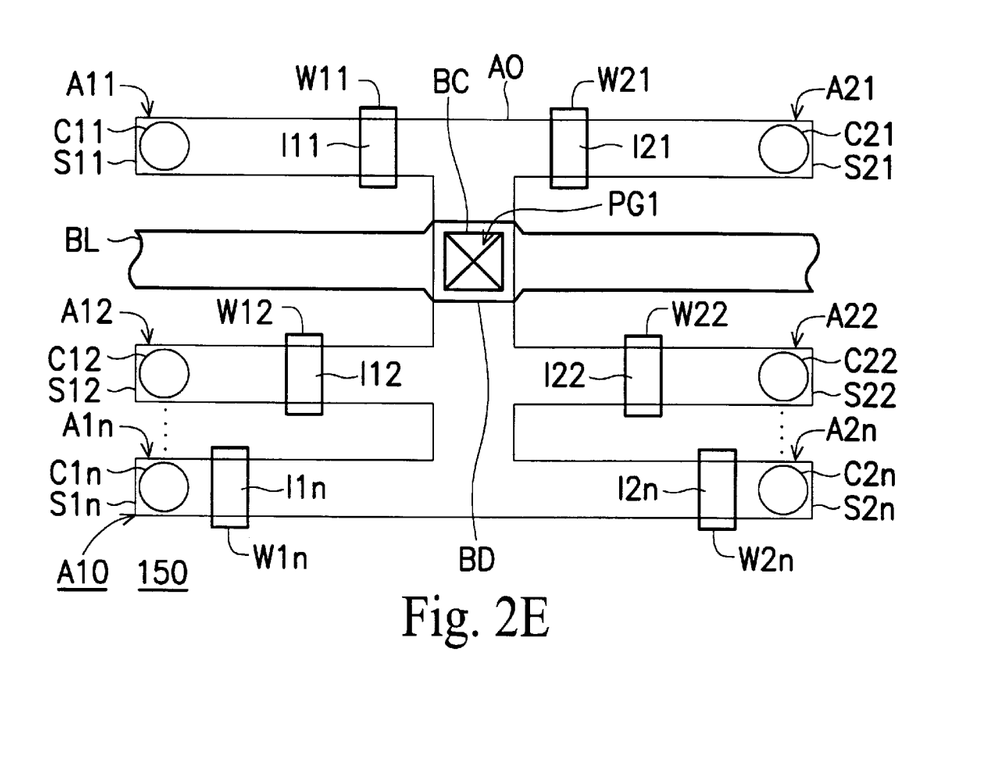

Now refer to FIG. 2E. A bit-line BL, crossing over the center region A0, is electrically connected to the sharing drain region BD via the bit-line contact BC. This electrical connection can be achieved by two ways. The first is to directly fill the bit-line contact BC with the bit-line BL. The second is to form a plug by filling the bit-line contact BC with metal materials, such as W or TiN, and then form the bit-line BL.

Figure 2F:
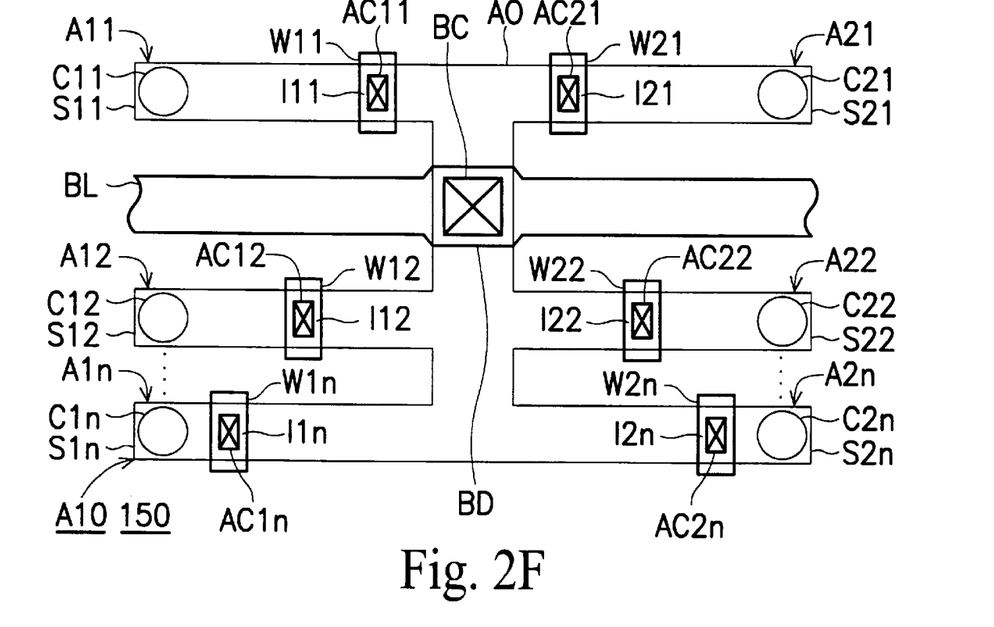

Now refer to FIG. 2F. In FIG. 2F, a second insulator (not shown) is formed to cap the substrate 150. A plurality of word-line contacts AC11~AC1n and AC21~AC2n, exposing partial surfaces of the word-lines W11~W1n and W21~W2n, are formed via defining the second insulator.

Figure 2G:
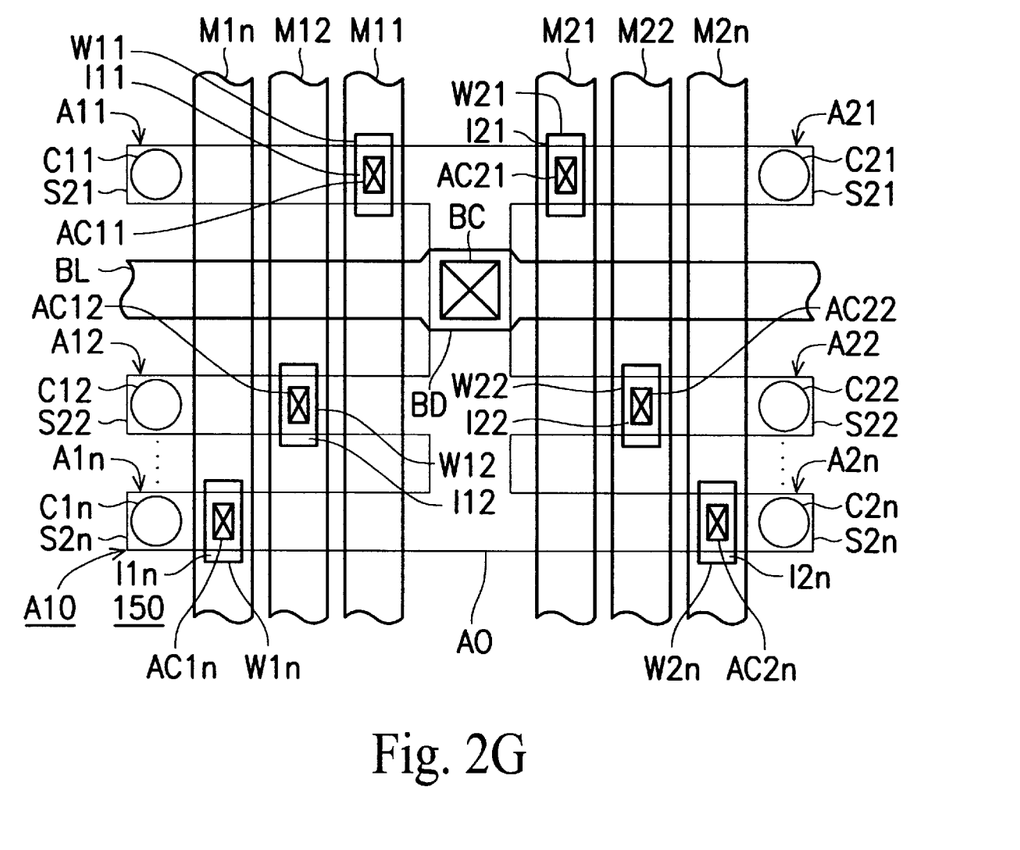

Now refer to FIG. 2G, a plurality of metal lines M11~M1n and M21~M2n are formed. These metal lines are electrically connected to the corresponding word-lines W11~W1n and W21~W2n via word-line contacts AC11~AC1n and AC21~AC2n. Further, isolation of metal-lines M11~M1n and M21~M2n can be achieved by the use of insulators.

Figure 1C:
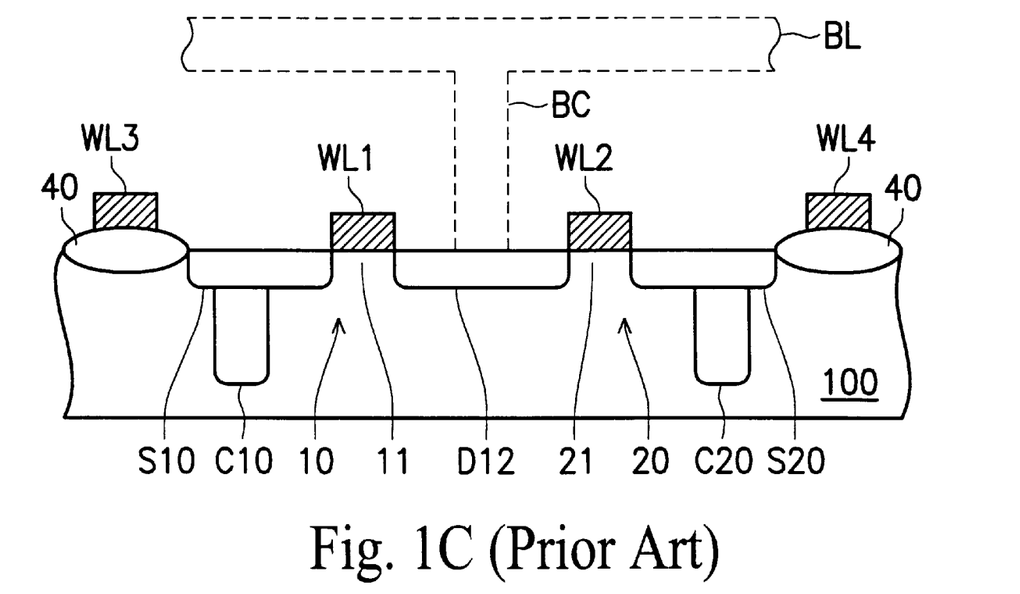
FIG. 1C is a cross-sectional diagram along line I—I in FIG. 1A.

A plurality of corresponding capacitors C11~C1n and C21~C2n are formed at source regions S11~S1n and S21~S2n. In this embodiment, a process pertaining to a trench capacitor is described. As shown in FIG. 1C the trench capacitors are formed at source regions under the substrate. However, as shown in FIG. 1B stacked capacitors can be used in the present invention, and these stacked capacitors are formed at the surface of source regions.

Therefore, in a DRAM array, multiple memory cells can share the same bit-line contact for higher integration.

Figure 3A:
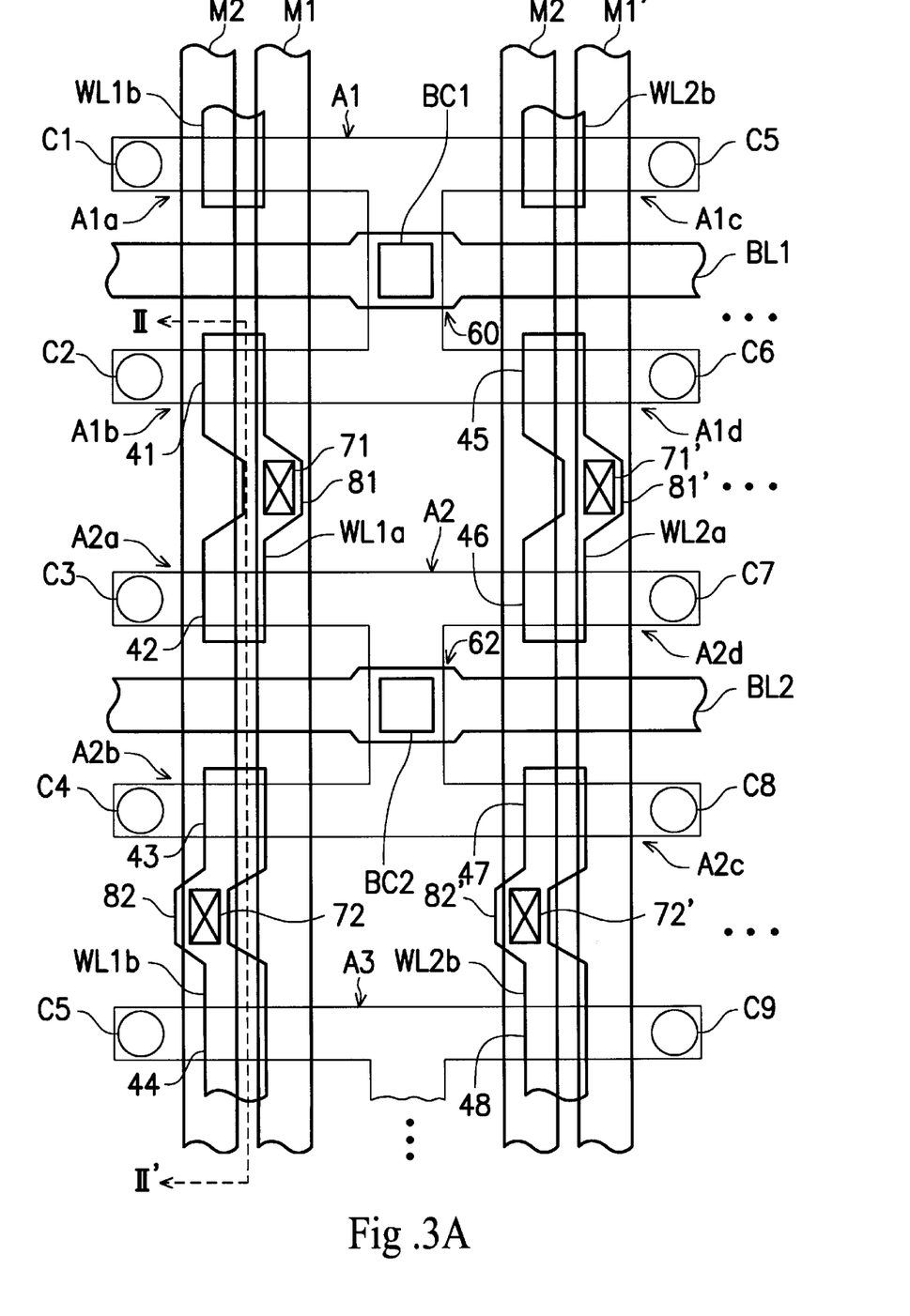
FIG. 3A shows a layout of a DRAM array of another embodiment of the present invention.
Figure 3B:
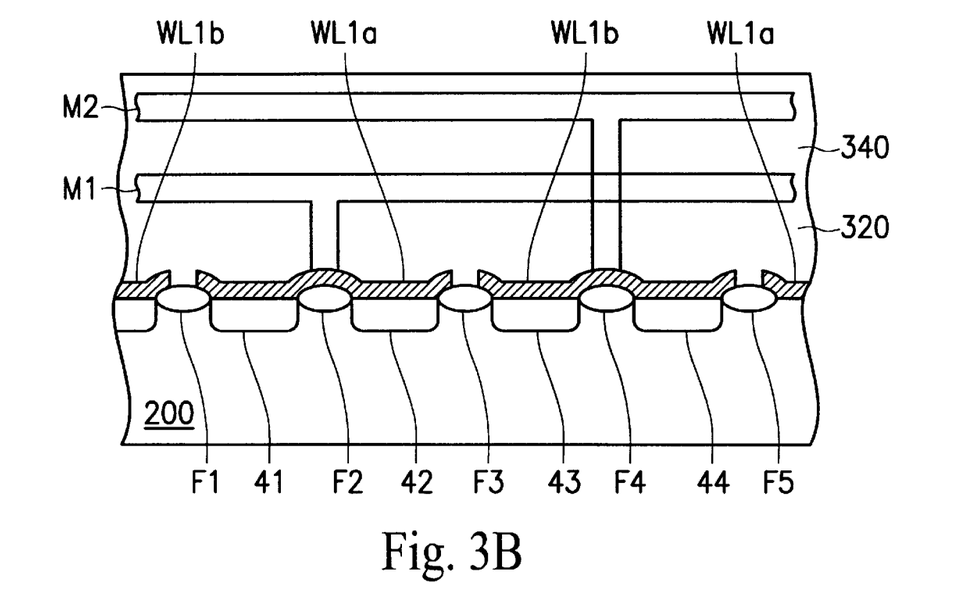
FIG. 3B is a cross-sectional diagram along line I—I of FIG. 3A.

Now refer to FIG. 3A and 3B to show the process of a DRAM array in the case of four memory cells sharing the same bit-line contact.

Now refer to FIG. 3A. On the substrate 200, an I-shaped active region array is formed. The I-shaped active region array comprises a plurality of I-shaped active regions in the form of array.

Then, a first conducting layer is formed on the I-shaped active region array. After the first conducting layer is defined, a plurality of individual word-lines, such as WL1a, WL1b, WL2a, and WL2b etc., are formed. These word-lines are disconnected from each other, because the lower protrusion region A1b of the I-shaped active region A1 is adjacent to the upper protrusion region A2a of the I-shaped active region A2. For simplicity, each word-line crosses over the lower protrusion region of one I-shaped active region and the upper protrusion of next I-shaped active region.

Then, these word-lines WL1a, WL1b, WL2a, and WL2b are used as masks to implant ions into these I-shaped active regions. The source regions are formed outside the protrusion regions A1a~A1d and A2a~A2d of these I-shaped active regions. The drain regions are formed in the center of these I-shaped active regions. The channel regions 41~44 and 45~48 are formed at the portion of these I-shaped active regions under these word-lines.

Then, an insulator (not shown) is formed to cap the substrate 200. After the insulator is defined, a plurality of bit-line contacts BC1 and BC2 are formed to expose part of the surfaces of the center regions 60, 62 of these I-shaped active regions.

Then the bit-lines, BL1 and BL2, are formed. The bit-lines cross the center regions 60, 62 of these I-shaped active regions and are electrically connected to the drain regions via the bit-line contacts BC1 and BC2.

Refer to FIG. 3B, an insulator 320 is formed to cap the substrate 200. After the insulator 320 is defined, a plurality of odd-number metal-line contacts 71, 71' are formed. These odd-number metal-line contacts 71, 71' expose part of the surface of odd-number word-lines WL1a, WL2a.

In addition, in corporation to the multi-layer metal interconnection process, a plurality of metal lines, such M1, M1', are formed. These metal lines cross over the I-shaped active regions in row and are electrically connected to word-lines WL1a, WL2a via the corresponding odd-number metal-line contacts 71, 71' to complete a DRAM array.

On the substrate 200, insulators, such as F1~F5 shown in FIG. 3B, are formed to isolate the I-shaped active region array.

At the segment between two adjacent I-shaped active regions, the odd-number word-lines, such as WL1a and WL2a, form odd-number connections 81, 81' with one side protruding. The odd-number metal-line contacts, such as 71 and 71', connect to the odd-number word-lines via odd-number connections 81, 81'.

Similarly, at the segment between two adjacent I-shaped active regions, the even-number word-lines, such as WL1b and WL2b, form even-number connections 82, 82' with the other side protruding. The even-number metal-line contacts, such as 72 and 72', connect to the even-number word-lines via even-number connections 82, 82'.

The material of the substrate 200 is selected from the following group: Si, Ge, or GaAs. The process for forming the substrate is selected from the following group: "expitaxial" or "silicon on insulator." For simplicity, a P-type substrate is described as follows.

First, a P-type substrate 200 is formed by a prior art. Then, a thermal oxidation process, such as LOCOS, is used to form field insulators F1~F5 with a thickness of 1500~5000Å to isolate the active regions. On the active regions, such as A1 and A2 shown in FIG. 3A, word-lines WL1a, WL1b, channel regions 4~44, and source/drain regions are formed by a semiconductor process, for example, deposition, etching, and ion-implantation. The word-lines mainly comprise a conducting layer, for example, polysicilon material. The conducting layer is processed by diffusion or ion-implantation for implanting As or P ions, or processed by an in-situ doped method for forming a doped conductor layer.

The insulators 320 or 340, made of BPSG, are used to isolate memory cells from the subsequent conducting layers. The insulators can be formed by one of the prior arts.

Figure 4:
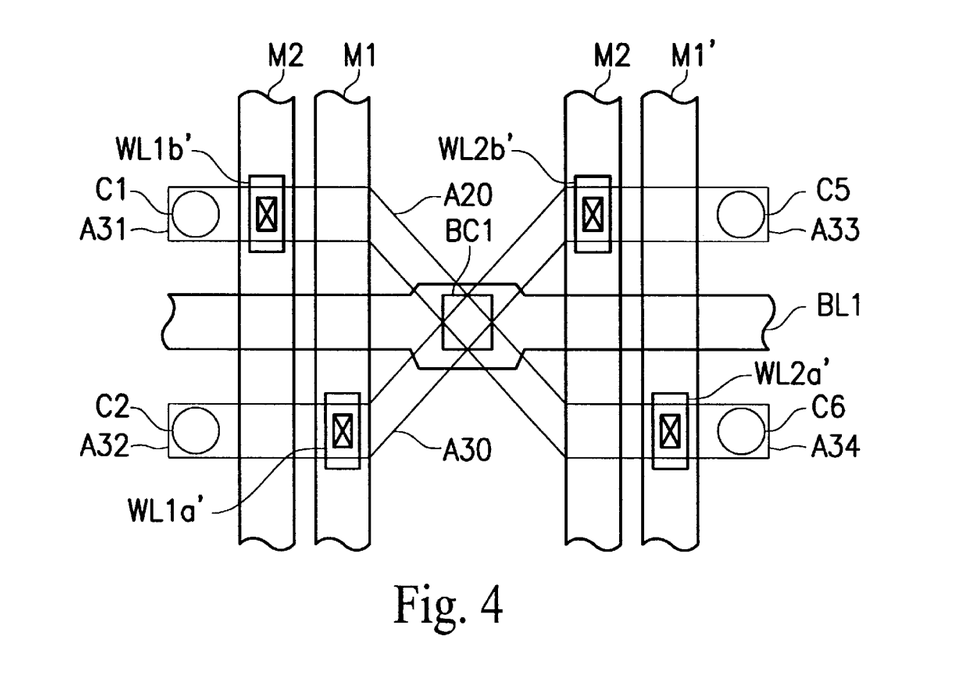
FIG. 4 shows a layout of a DRAM array of still another embodiment of the present invention.

Now refer to FIG. 4 which shows layout of DRAM array of another embodiment of the present invention. The characteristic of this embodiment relies on replacing the I-shaped active regions with X-shaped active regions. A plurality of individual word-lines, such as WL1a', WL1', WL2a' and WL2b', cross over the corresponding protrusion regions A31~A34.

The word-lines are respectively controlled by metal lines M1, M2, M1' and M2'. When incorporated in a memory cell array consisting of word-lines and bit-lines, four memory cells can share the same bit-line with no data conflict.

The processes for forming insulating conducting layers of stacked or trench capacitors, plugs, and insulators are skipped because they belong to the prior art.

The present invention can be applied in a DRAM array. The size of the desired device is greatly reduced.

Although the invention has been described in connection with preferred embodiments, modifications will now doubtlessly be apparent to those skilled in this technology. The foregoing description of the preferred embodiments of the invention has been provided for the purposes of illustration and description. It is not intended to be exhaustive or to limit the invention to the precise embodiment disclosed herein. The disclosed embodiment has been chosen and described to best explain the principles of the invention and its practical application, thereby enabling others skilled in this technology to understand the invention, to practice various other embodiments thereof and to make various modifications suited to the particular use contemplated of the present invention. As such, it is intended that the scope of this invention shall not be limited to the disclosed, but rather shall be defined by the following claims and their equivalents.

What is claimed is:

1. A DRAM structure with multiple memory cells sharing the same bit-line contact, comprising:

a substrate;

an active region, formed on said substrate, with a center region and a plurality of protrusion regions connecting to the two sides of said center region;

a plurality of word-lines, disconnected from each other, each crossing said corresponding protrusion region;

a plurality of channel regions, formed where said protrusion region overlap with said word-lines;

a plurality of source regions, formed at the outer areas of said channel regions;

a sharing drain region, formed at said center region of said active region;

a bit-line contact, formed on surface of said sharing drain region;

a bit-line, crossing said center region and electrically connected to said sharing drain region via said bit-line contact;

a plurality of capacitors, electrically connected to said source regions; and a plurality of metal lines, electrically connected to said corresponding word-lines.

2. The DRAM structure of claim 1, where said capacitor is a stack capacitor and is formed on the surface of said source regions.

3. The DRAM structure of claim 1, where said capacitor is a trench capacitor and is formed under the surface of said source regions.

4. The DRAM structure of claim 1, wherein said metal lines are stacked on different planes in 3D.

5. The DRAM structure of claim 1, further comprising a first plug filling said bit-line contact to electrically connect said bit-line to said sharing drain region.

6. The DRAM structure of claim 1, further comprising a plurality of word-line contacts on the surface of said word-lines.

* * * * *